(12) United States Patent
Doerrich et al.

(10) Patent No.: US 8,737,059 B2
(45) Date of Patent: May 27, 2014

(54) METHOD AND APPARATUS FOR CONTROLLING AND MONITORING AND AIR-CONDITIONING SYSTEM OF A DATA PROCESSING INSTALLATION

(75) Inventors: Martin Doerrich, Mittenaar (DE); Michael Nicolai, Rabenau (DE)

(73) Assignee: Rittal GmbH & Co. KG, Herborn (DE)

( * ) Notice: Subject to any disclaimer, the term of this patent is extended or adjusted under 35 U.S.C. 154(b) by 192 days.

(21) Appl. No.: 13/363,755

(22) Filed: Feb. 1, 2012

(65) Prior Publication Data

US 2012/0205089 A1 Aug. 16, 2012

(30) Foreign Application Priority Data

Feb. 10, 2011 (DE) .......................... 10 2011 000 638

(51) Int. Cl.
*G06F 1/20* (2006.01)
*H05K 7/20* (2006.01)

(52) U.S. Cl.
USPC ............ 361/679.47; 361/679.48; 361/679.53; 361/588; 361/695; 361/698; 361/699; 165/104.33; 700/300

(58) Field of Classification Search
USPC ............... 361/679.48, 679.52, 694–695, 699, 361/679.47, 688, 698; 165/104.33; 454/154; 700/300
See application file for complete search history.

(56) References Cited

U.S. PATENT DOCUMENTS

| | | | |
|---|---|---|---|
| 6,859,366 B2 | 2/2005 | Fink | |
| 7,010,392 B2 * | 3/2006 | Bash et al. | 700/276 |
| 7,259,963 B2 * | 8/2007 | Germagian et al. | 361/695 |
| 7,365,973 B2 * | 4/2008 | Rasmussen et al. | 361/694 |
| 7,630,795 B2 * | 12/2009 | Campbell et al. | 700/300 |
| 8,004,839 B2 * | 8/2011 | Sato et al. | 361/696 |
| 8,156,753 B2 * | 4/2012 | VanGilder et al. | 62/259.2 |
| 8,514,575 B2 * | 8/2013 | Goth et al. | 361/698 |
| 2006/0225449 A1 | 10/2006 | Dorrich | |
| 2007/0163748 A1 * | 7/2007 | Rasmussen et al. | 165/53 |
| 2007/0167125 A1 * | 7/2007 | Rasmussen et al. | 454/184 |
| 2008/0198549 A1 * | 8/2008 | Rasmussen et al. | 361/696 |

(Continued)

FOREIGN PATENT DOCUMENTS

| | | | |
|---|---|---|---|
| GB | 2480401 | 11/2011 | |
| WO | 03083631 | 10/2003 | |
| WO | WO 2010100115 A1 * | 9/2010 | H05K 7/20 |

OTHER PUBLICATIONS

Rittal GmbH & Co. KG: Rittal Liquid Cooling Package T3+. Betriebs- and Wartungsanleitung. Herbon: Rittal, 12.03.2009.-ISBN n. b.

(Continued)

*Primary Examiner* — Robert J Hoffberg
(74) *Attorney, Agent, or Firm* — Marshall & Melhorn, LLC

(57) ABSTRACT

A method and apparatus for controlling and monitoring an air-conditioning system of a data processing installation includes at least one server switchgear cabinet for accommodating electrical units. Controlling of the cooling power of an air-conditioning unit is performed in at least two distinct defined modes, wherein in a first mode the air volume capacity of a blower is controlled to a minimum value at a maximum defined temperature difference between sucked hot air and supplied cold air, and in a second mode the cooling power is controlled such that a maximum defined temperature for the cooling medium flowing from a heat exchanger is not exceeded. The method and apparatus provide energy-saving cooling of such data processing installations.

10 Claims, 3 Drawing Sheets

(56) References Cited

U.S. PATENT DOCUMENTS

| | | | |
|---|---|---|---|
| 2008/0232064 A1* | 9/2008 | Sato et al. | 361/687 |
| 2009/0259343 A1* | 10/2009 | Rasmussen et al. | 700/282 |
| 2010/0216388 A1* | 8/2010 | Tresh et al. | 454/184 |
| 2010/0291855 A1* | 11/2010 | Nonn et al. | 454/184 |
| 2010/0304657 A1 | 12/2010 | Gallmann | |
| 2011/0209852 A1* | 9/2011 | Enlund | 165/104.11 |
| 2012/0037353 A1* | 2/2012 | Coors | 165/279 |
| 2012/0087087 A1* | 4/2012 | Nicolai et al. | 361/679.48 |
| 2012/0118534 A1* | 5/2012 | Goth et al. | 165/104.13 |

OTHER PUBLICATIONS

Rittal GmbH & Co. KG: Rittal IT-Cooling Solutions. Firmenschrfit. Ausg. 03/08. Herborn: Rittal, 2008.- ISBN n. b.

Rittal GmbH & Co. KG: Rittal Handbuch HB 32/System-Kilimatisierung. Ausg. Nov. 2007. Herborn: Rittal, 2007.-ISBN n. b.

* cited by examiner

METHOD AND APPARATUS FOR CONTROLLING AND MONITORING AND AIR-CONDITIONING SYSTEM OF A DATA PROCESSING INSTALLATION

BACKGROUND OF THE INVENTION

The invention relates to a method for controlling and monitoring an air-conditioning system of a data processing installation comprising at least one server switchgear cabinet for accommodating electrical units, wherein hot air is sucked by an air-conditioning device via a hot air suction, is cooled and is blown via a cold air injection indirectly or directly into the server switchgear cabinet or into a cold aisle which is confined by a row of server switch gear cabinets, wherein cold air is sucked from at least one of the server switchgear cabinets from the cold aisle and is trans-ported into a hot aisle separated from the cold aisle or into the ambient space, wherein, by temperature sensors, the temperature of supply air and exhaust air of the air-conditioning device on the inlet side and on the outlet side and, by further temperature sensors, the temperature of a cooling medium passing one or heat exchangers in the air-conditioning device for dissipation of the heat loss on the inlet side and on the outlet side are determined, analyzed and the power of at least one blower in the air-conditioning device is controlled.

The invention further relates to a respective apparatus for performing the method.

Data processing installations normally consist of a plurality of server switchgear cabinets into which individual electronic modules (so-called racks) having their own blowers with cold air suctions and hot air outlets for cooling are installed.

These server switchgear cabinets are arranged in several rows and are aligned such that cold air suctions or hot air outlets, respectively, of the individual server switchgear cabinets are opposite to each other and respective cold aisles and hot aisles are alternatively formed between the server switchgear cabinets. In an arrangement of two rows of server switchgear cabinet normally a cold aisle is formed between the two rows of server switchgear cabinets. Hot air outlets of the server switchgear cabinets are located at the outside of this arrangement and blow hot air into the ambient space.

Different concepts for air-conditioning or in particular for cooling these data processing installations are known from the prior art.

For example, it may be provided that hot air blown from server switchgear cabinets is centrally sucked and cooled by an air-conditioning system, and the cold air is blown into the cold aisle. To enhance efficiency of cooling, normally the cold aisle is sealed off against the hot aisles are the ambient space, respectively, laterally and at the top. Such arrangements are for example described in documents WO 03/083631 and U.S. Pat. No. 6,859,366 B2.

In view of a particularly effective air-conditioning of such arrangement, so-called inline air-conditioning devices have proven which are arranged between the server switchgear cabinets at specific distances, depending on the power loss of the data processing installation to be dissipated. These air-conditioning devices comprise blowers which suck the hot air from the hot aisles or from the ambient air through hot air suctions, cool it by one or more heat exchangers circulated by water and blow it through cold air injections into the sealed off cold aisles.

Product catalogue "RITTAL Handbuch 32/IT-Solutions", pages 726 ff as well as information brochure "RITTAL IT-Cooling Solutions", 03/08 for example, present respective air-conditioning devices under the name of "LCP Inline". LCP means Liquid Cooling Package and describes air-conditioning devices which may be placed between server switchgear cabinets within data processing installations and comprise heat exchangers having a water cooling.

In view of an optimum computer performance as well as in view of the operational reliability it is required that on the inlet side supply air having a specific maximum air temperature is offered to the racks within the server switchgear cabinets. If this temperature is reached or even exceeded, working life of the installed components may be drastically reduced resulting in high service costs. Therefore, it is required that inward flow of cold air is at all time adjusted to the demand of individually operating racks. To achieve this, a temperature controlled regulation of the blower capacity is currently used. If, for example, the temperature within the cold aisle rises, the blower capacity is increased.

DE 10 2005 011 179 B4 describes a method for monitoring the cooling mode in a unit arrangement having a receiving housing, in particular in a switchgear cabinet, wherein in its interior electrical units are accommodated and which has a cooling device. The cooling device is in air-guiding communication with the interior of the receiving housing via at least one air inlet and at least one blower aperture, wherein an inlet temperature sensor measures the temperature of air to be cooled which is supplied via the air inlet and an outlet temperature sensor measures the temperature of the cooled air exiting via the blower aperture and wherein the temperatures measured by the output temperature sensor are analyzed by a computing unit and are used for controlling the cooling device. Thereby it is provided that a cooling medium is supplied to the cooling device through a feed line and is removed through a return line, wherein in inlet temperature sensor is associated with the feed line and an outlet temperature sensor is associated with the return line, and wherein a difference signal is derived by a computing unit from temperature values measured by temperature sensors in the feed and return lines. Further, a volume flow meter is associated with the cooling device, feed or return line, wherein a signal corresponding to the quantity Q of heat, determined from the signal of the volume flow meter and from the difference signal of measured temperatures, is transmitted to a display unit by the computing unit. Furthermore, it is provided that a switch signal corresponding to the difference signal is supplied by which the cooling power of the cooling device is controlled wherein depending on the switch signal, the number of revolutions of at least one blower of the cooling device is controlled.

Generally, this method provides a sufficiently adequate cooling power and it may be correspondingly adjusted in case of insufficient cooling operation, wherein the overhead for monitoring the cooling operation can be kept low. Current requirements concerning energy efficiency and even facility management, however, require new control methods.

SUMMARY OF THE INVENTION

Therefore, it is the object of the invention to provide a control method which ensures an improved supply with cold air meeting the demands and also satisfies temperature requirements with respect to the cooling medium return.

The object concerning the method is solved in that controlling of the cooling power of the air-conditioning unit is performed in at least two distinct defined modes, wherein in a first mode the air volume capacity of the blower is controlled to a minimum value at a maximum defined temperature difference between the sucked hot air and supplied cold air, and in a second mode the cooling power is controlled such that a maximum defined temperature for cooling medium flowing from the heat exchanger is not exceeded.

The object concerning the apparatus is solved in that the control unit comprises means for a first control loop and a second control loop for controlling the cooling power of the air-conditioning device and at least two distinct operation modes are defined, wherein in a first mode the air supply volume of the blowers can be controlled by the control loop to a minimum value at a maximum defined temperature difference between sucked hot air and supplied cold air and in a second mode the cooling power can be controlled by the second control loop such that a maximum defined temperature for the cooling medium flowing from the heat exchanger is maintained.

It may be achieved by the method and by the apparatus that on the one hand an optimum and at the same time energy-saving cooling of such data processing installations is provided. Compared to the prior art, only that air flow is offered as is sucked from the individual server switchgear cabinets as cold air. This control as required assists in saving energy costs and especially in extending the working life of the blowers, since these can always be operated in their optimum working range. On the other hand, also requirements resulting from a facility management are satisfied when switching to the second operation mode. Return temperatures for the cooling medium which are too high can be avoided.

In the method according to the invention it may be provided that in the first operation mode of the air-conditioning device, the eco mode or standard mode, an adjustable temperature difference adjustable on the air side can be used as reference variable and the flow of cooling medium at constant air supply volume is varied to control it. Thereby, in particular an energy-saving cooling of the data processing installation may be realized.

When the air supply volume is increased in case of deviation under a minimum admissible temperature in the cold air injection, condensation of air humidity on moisture-sensitive electronic devices in the server switchgear cabinets can be avoided.

To avoid excessively high temperatures in the cooling medium return, it is provided in the method according to the invention, that in the second operating mode, the so-called facility management mode (FM mode) of the air-conditioning device, a second control is superimposed on the first control for the adjustable temperature difference on the air side, and as a reference variable for the second control an adjustable temperature difference between cooling medium feed and cooling medium return is used.

Thereby, it can be provided, that, as long as the real power loss remains below a planned power loss, the air-conditioning device is operated in the first operating mode and that in case of exceeding the planned power loss the air temperature of the cold air injection is increased. By doing this, the difference between feed temperature and return temperature of the cooling medium can be fixed to the defined allowed value in a large cooling power range of the air-conditioning device without compromising effectiveness of the cooling power of the air-conditioning device.

However, since in this FM mode for maintaining the maximum difference between feed temperature and return temperature of the cooling medium the cooling power of the air-conditioning device is artificially restricted, it is provided that upon activation of the second operating mode of the air-conditioning device a warning is generated at an alarm means and/or a service unit. This may for example be realized by a plain text warning at the service terminal and/or by warning lights.

Further, it may be provided that switching to the second operating mode of the air-conditioning device via a service unit is performed with controlled access, so that this switching may only be performed by competent personal.

The apparatus provides in a preferred embodiment that the control unit is connected to an optical and/or acoustical warning means and/or with a superordinate monitoring means of the data processing installation or a service unit so that switching to the second operating modus of the air-conditioning device is allowed with controlled access.

In a preferred modification of the method water is used as the cooling medium wherein a monitoring of supply of hot return water from the heat exchangers to external chillers is performed. Thus, it can be avoided that faults within the waste water system in the cooling system, respectively, of the building in which the data processing installation is located, are induced at too high temperatures of the return water.

In an advantageous manner, a use of the method as previously described in conjunction with further control strategies for regulating the cooling power of the air-conditioning device may be provided. An example is a method and an apparatus for controlling an air-conditioning system for a data processing installation comprising at least one row of server switchgear cabinets, wherein the row of server switchgear cabinets confines a cold aisle which is sealed off against a hot aisle facing away the cold aisle side, wherein hot air is sucked, cooled and blown into the cold aisle by at least one air-conditioning device and wherein cold air is sucked from the cold aisle from at least one of the server switchgear cabinets and is conveyed into the hot aisle or into the ambient space. Thereby, it is provided that control of the air supply volume of the air-conditioning device is performed by a pressure control, wherein as the input parameter of the pressure regulation a measured pressure difference between a pressure sensor in the cold aisle or in the hot aisle and a pressure sensor in the ambient space outside the cold aisle or the hot aisle is used. The apparatus comprises a respective control unit for performing the method. Thereby, it may be achieved that, on the one hand, an optimum and simultaneously energy-saving cooling of data processing installations is provided. On the other hand, operating safety is enhanced, since failure or defects of the air ventilation may be detected immediately. Furthermore, requirements of a facility management may also be considered.

BRIEF DESCRIPTION OF THE DRAWINGS

The invention will be explained in detail below with the aid of an exemplary embodiment illustrated in the figure. It is shown in.

DETAILED DESCRIPTION OF THE INVENTION

Figure 1:
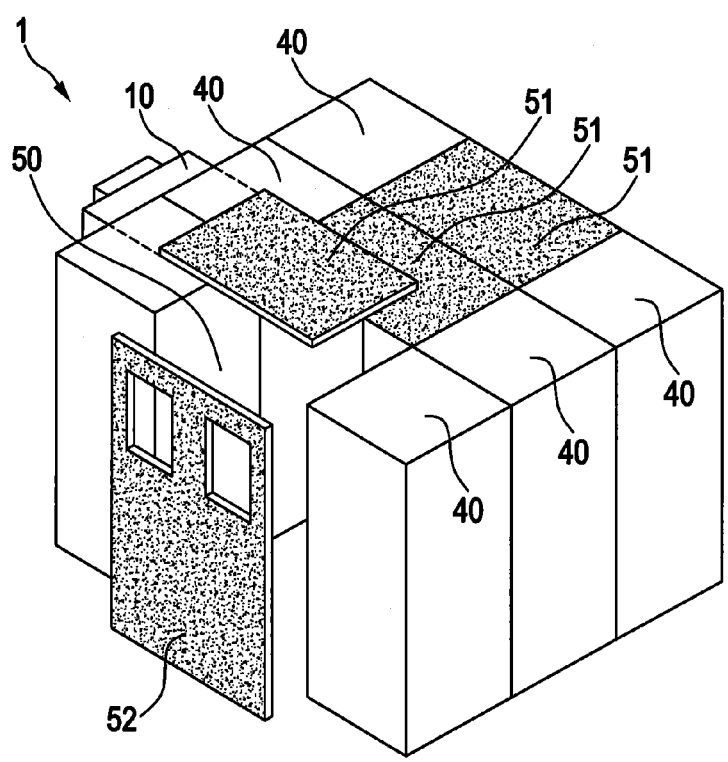
FIG. 1 a data processing installation, consisting of two rows of server switchgear cabinets, in a perspective illustration.

FIG. 1 shows in part a data processing installation 1 mentioned in the introductory which is composed of several server switchgear cabinets 40. As usual, server switchgear cabinets 40 are spaced apart in two rows, so that a cold aisle 50 is formed. Cold aisle 50 is sealed off against the ambient space by plates for ceiling separation 51 as well as by door separations 52. An air-conditioning device 10 is provided for cooling which is placed between server switchgear cabinets 40 and sucks hot air from the ambient space outside, cools it and blows it as cold air into cold aisle 50. Each of the server switchgear cabinets possesses a plurality of system modules having individual blowers operating independently from another which suck the cold air in cold aisle 50. Subsequently, air heated by the power loss is discharged into the space surrounding data processing installation 1.

Allow to remark in this context that the method according to the invention and the respective apparatus also refers to an arrangement of server switchgear cabinets consisting of only one row of server switchgear cabinets 40 and forming a cold aisle 50 or a hot aisle together with a wall opposite cold air suctions 41 or hot air outlets 42 of server switchgear cabinets 40 and which are sealed off against the ambient space by separations. Further, it may be provided that the cold air may be blown directly into server switchgear cabinets 40.

Figure 2:
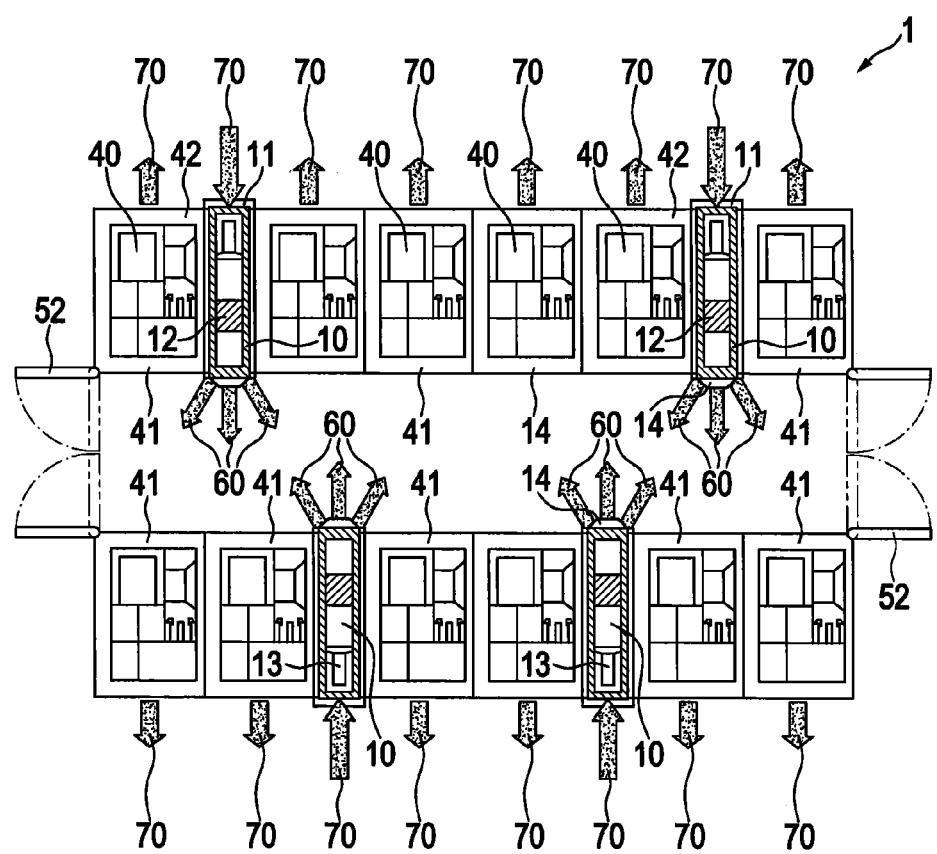
FIG. 2 a layout of a data processing installation comprising server switchgear cabinets and several air-conditioning devices.

FIG. 2 shows a layout of a data processing installation 1 comprising several sever switchgear cabinets 40 and several air-conditioning devices 10, as for example known by the name of "LCP Inline" of the applicant, arranged between server switchgear cabinets 40.

Server switchgear cabinets 40 are arranged in two rows, wherein a cold aisle 50 is formed between the rows which is virtually hermetically sealed off against the ambient space by door separations 52 and ceiling separations 51 (not visible in this view). By means of air-conditioning devices 10, hot air from the ambient space is sucked by blowers 13 via a hot air suction 11 and is cooled by heat exchangers 12. Cooling water is circulated in heat exchangers 12. Thus, cooled air is supplied as cold air to cold aisle 50 via cold air injections 14.

At their side facing cold aisle 50 server switchgear cabinets 40 possess cold air suctions 41 via which cold air form cold aisle 50 may be sucked individually, according to the installed system components and current need of cold air. Air heated by power loss is in turn supplied to the space surrounding data processing installation 1 via corresponding hot air outlets 42.

Distinctly shaded arrows symbolize a respective cold air flow 60 and hot air flow 70.

Figure 3:
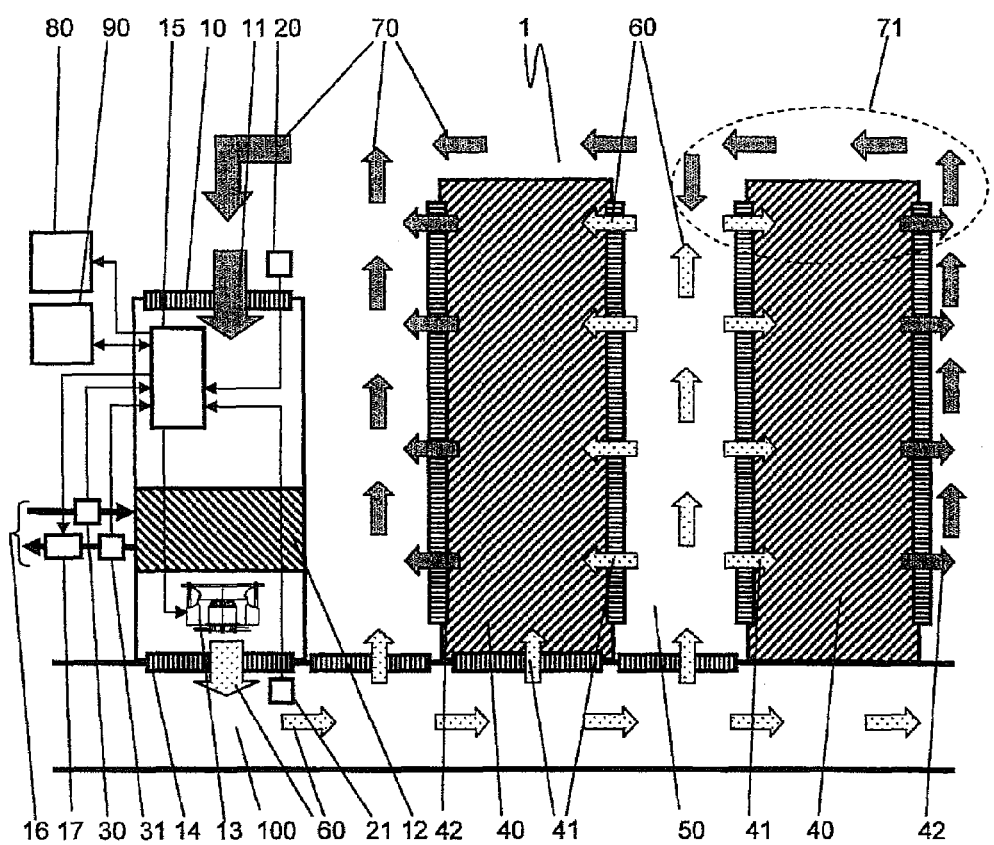
FIG. 3 in a schematic representation an air-conditioning device having a control unit for performing the control method according to the invention.

FIG. 3 shows schematically the apparatus according to the invention for performing the method according to the invention.

Shown as part of the data processing installation 1 are an air-conditioning device 10 and exemplarily two server switchgear cabinets 40 which are arranged opposite to another, separated by cold aisle 50.

Cold air and hot air flows 60, 70 are represented as block arrows in the figure. Hot air is sucked from the ambient space via hot air suction 11 of air-conditioning device 10 by one or more blowers 13, wherein usually on the inlet side air filters are provided which, however, are not shown here. Subsequently, the hot air is passed through heat exchanger 12, and the air is cooled thereby. Heat exchanger 12 possesses a cooling water circuit 16 having feed and return lines by which heat extracted from the air may be removed. Cooling circuits through which a refrigerant or brine flows, are possible. Then, cold air is supplied to cold aisle 50 via cold air injection 14 which is guided within a raised floor 100 and is supplied from below through ventilation grill directly into server switchgear cabinets 40 and/or indirectly via cold aisle 50 to server switchgear cabinets 40.

Data processing components (racks) installed in server switchgear cabinets 40 suck cold air via respective cold air suctions 41. Then, heated air flows through respective hot air outlets 42 which are arranged opposite cold air suctions 41, into the space surrounding the arrangement. To avoid recirculation 71, as was generated at the right hand server switchgear cabinet 40, ceiling separations 51 described in FIGS. 1 and 2 are provided.

According to the invention, a control unit 15 is provided for air volume control which is in the illustrated example a constituent of air-conditioning device 10. It is also possible that it is a constituent of a superordinate monitoring device of data processing installation 1. On the inlet side temperature sensors 20, 21 for measuring the air temperature of the sucked hot air and blown of cold air as well as further temperature sensors 30, 31 for measuring the water temperature in feed and return lines of cooling water circuit 16 are connected. Further, cooling water circuit 16 comprises a valve 17 which is embodied as motor actuated continuously opening valve or as magnetic valve and which is controlled by control unit 15. Further, a volume flow meter may be provided to determine the quantity of heat (cp. DE 10 2005 011 179 B4). Activation of blowers 13 occurs by control unit 15 in the shown example. In the shown example, a warning means 80 (e.g. warning light, horn and/or superordinate monitoring installation) as well as a service unit 90 embodied as terminal or a superordinate monitoring installation of other processing installation 1 are connected as external component through which status of air-conditioning devices 10 within data processing installation 1 may be displayed or into which commands may be entered for maintenance purposes.

Typical values of such an installation are stated below. Within raised floor 100, the air temperature or cold air injection 14 is typically 16° C. to 20° C. wherein a volume flow of 4 to 6 m/s, and a positive pressure of about 40 to 80 Pa are predominant. The temperature of hot air flow 70 downstream of hot air outlets 42 of server switchgear cabinets 40 may assume values in a range from 20° C. to 30° C. The air temperature at hot air suction 11 of air-conditioning device 10 may be about 22° C. to 24° C.

In one of the operating modes, the so-called eco mode or standard mode, the air volume capacity of blowers 13 at a maximum defined temperature difference $\Delta T$ between sucked hot air and delivered cold air is controlled such that blowers 13 are maintained on an air volume flow which is as small as possible, at which maximum $\Delta T$ which is adjustable, is not exceeded. Thus, reference variable is $\Delta T$ on the air side. Regulation of the water circuit only serves to keep the supply air temperature in a defined range of typically 20° C. to 25° C., which is adjustable. Before increasing the revolution number of blowers and thus volume flow, it must be tried to keep $\Delta T$ on the air side constant by increasing flow on the water side. When minimum admissible server in-blow temperature is undergone, volume flow must be increased. The typical operating point in the eco mode is a supply air temperature to the server which is as high as possible and $\Delta T$ on the air side which is as high as possible. In this control variant, air-conditioning device 10 guides the servers on the air side. Exactly that air volume is circulated which is necessary for maximizing the admissible $\Delta T$. Thereby, the servers tend to be operated at the thermodynamical limit. Thus, it may be achieved that electric power consumption and thus operating costs for the blowers may be reduced to a minimum.

In the second operating mode, the so-called facility management mode (FM mode), a control to constant $\Delta T$ on the water side is performed to avoid that external chillers are supplied with return flow water which is too hot and thus possibly faults may occur. It is $$\text{water feed flow temperature} + \Delta T = \text{water return flow temperature} \quad (1)$$

The feed flow temperature may be detected by temperature sensor 30 wherein merely a maximum allowed value for ΔT must be input.

The following example is given:
Planned power loss 10 kW
Feed flow temperature (measured) 12° C.
Predefined ΔT 6° C. corresponding to a maximum return flow temperature of 18° C.

Server supply air temperature results according to relevant characteristic for air-conditioning device 10. As long as real power loss is less than planned power loss, the device controls in the standard mode. When the real power loss exceeds maximum planned power loss, server air supply temperature will equally rise. Thereby it is provided that a warning is activated upon activation of the FM mode which may be worded as follows: "Attention, maximum cooling power was limited artificially. If real power loss is larger than planned power loss, set point of server air supply temperature cannot be maintained."

Switching between these modes must therefore be protected by an access control, e.g. with a password on the service side of service unit 90 or superordinate monitoring of data processing installment 1. Changes may be made only by competent service personal.

By the method and by the apparatus, it may be achieved that on the one hand an optimum and simultaneously energy-saving cooling of such data processing installments 1 is provided. On the other hand, requirements resulting from a facility management are satisfied.

What is claimed is:

1. A method for controlling and monitoring an air-conditioning system of a data processing installation comprising at least one server switchgear cabinet for accommodating electrical units, wherein hot air is sucked by an air-conditioning device via a hot air suction, is cooled to cold air and is blown via a cold air injection indirectly or directly into the at least one server switchgear cabinet or into a cold aisle which is confined by two rows, each of the rows including at least one of the at least one server switchgear cabinet or the air-conditioning device, wherein the cold air is sucked from the at least one of the server switchgear cabinet from the cold aisle and is transported into a hot aisle separated from the cold aisle or into an ambient space, wherein, by air temperature sensors, temperatures of the hot air at the hot air suction and the cold air at the cold air injection of the air-conditioning device and, by cooling medium temperature sensors, temperatures of a cooling medium passing through one or more heat exchangers in the air-conditioning device for dissipation of a heat loss on a cooling medium inlet side and on a cooling medium outlet side are determined, analyzed and a power of at least one blower in the air-conditioning device is controlled, wherein controlling of a cooling power of the air-conditioning device is performed in at least two distinct defined modes, wherein in a first operating mode of the at least two distinct defined modes, an air supply volume capacity of the at least one blower is controlled to a minimum value at a maximum defined temperature difference between the hot air and the cold air, the maximum defined temperature difference between the hot air and the cold air is used as a reference variable, and a cooling medium flow of the cooling medium is varied at the minimum value of the air supply volume for controlling the maximum defined temperature difference, and in a second operating mode of the at least two distinct defined modes, the cooling power is controlled such that a maximum defined temperature for the cooling medium flowing from the one or more heat exchanger is not exceeded.

2. The method of claim 1, wherein the air supply volume is increased when a minimum admissible temperature is undergone at the cold air injection.

3. The method of claim 1, wherein in the second operating mode of air-conditioning device, a second control is superimposed on a first control for the temperature difference which is adjustable between the hot air and the cold air, and an adjustable temperature difference between the cooling medium inlet side and the cooling medium outlet side is used as a reference variable for the second control.

4. The method of claim 1, wherein when a real power loss is lower than a planned power loss, the air-conditioning device is operated in the first operating mode and, when the real power loss is equal to greater than the planned power loss, the air-conditioning device is operated in the first operating mode or the second operating mode and the air temperature of the cold air at the cold air injection rises.

5. The method of claim 1, wherein upon activation of the second operating mode of the air-conditioning device, a warning is generated at a warning means and/or a service unit.

6. The method of claim 1, wherein switching to the second operating mode of the air-conditioning device is performed via a service unit with controlled access.

7. The method of claim 1, wherein water is used as the cooling medium and monitoring of a supply of hot return flow water from the at least one heat exchanger to external chillers is performed.

8. A method of controlling the cooling power of the air-conditioning device utilizing the method according to claim 1 and further comprising control of an air supply volume of the air-conditioning device by a pressure control.

9. An apparatus for controlling and monitoring of an air-conditioning system for a data processing installation comprising at least one server switchgear cabinet for accommodating electric units, wherein hot air is sucked by an air-conditioning device via a hot air suction and is cooled to cold air and is passed via a cold air injection indirectly or directly into the at least one server switchgear cabinet or into a cold aisle which is confined by two rows, each of the rows including at least one of the at least one server switch gear cabinet or the air-conditioning device, wherein the cold air is sucked from the at least one the server switchgear cabinet from the cold aisle and is transported into a hot aisle separated from the cold aisle or into an ambient space, wherein, by air temperature sensors, temperatures of the hot air at the hot air suction and the cold air at the cold air injection of the air-conditioning device and, by cooling medium temperature sensors, the temperatures of a cooling medium passing through one or more heat exchangers in the air-conditioning device for dissipation of a heat loss of a cooling medium inlet side and on a cooling medium outlet side are determined and, by a control unit of the air-conditioning device which is connected to the aft temperature sensors, are analyzed and power of at least one blower in the air-conditioning device is controlled, wherein the control unit comprises a means for a first control loop and a means for a second control loop for controlling cooling power of the air-conditioning device and at least two distinct operating modes are predefined, wherein in a first operating mode of the at least two distinct operating modes, an air supply volume of the at least one blower is controlled to a minimum value by the means for the first control loop at a maximum defined temperature difference between the hot air and the cold air, the maximum defined temperature difference between the hot air and the cold air is used as a reference variable, and a cooling medium flow of the cooling medium is varied at the minimum value of the air supply volume for controlling the maximum defined temperature difference, and in a second operating mode of the at least two distinct operating modes, by the means for the second control loop, the cooling power is controlled such that a maximum defined temperature for the cooling medium flowing from the one or more heat exchanger is maintained.

10. The apparatus of claim 9, wherein the control unit is connected on its output side with at least one of an optical warning means, an acoustical warning means, a superordinate monitoring installation of the data processing installation or a service unit, by which switching to the second operating mode of the air-conditioning device occurs with controlled access.

* * * * *